US012656189B2

(12) United States Patent
Wang et al.

(10) Patent No.: US 12,656,189 B2
(45) Date of Patent: Jun. 16, 2026

(54) SEMICONDUCTOR DEVICE

(71) Applicants: DYNEX SEMICONDUCTOR LIMITED, Lincoln (GB); ZHUZHOU CRRC TIMES SEMICONDUCTOR CO. LTD, Zhuzhou (CN)

(72) Inventors: Yangang Wang, Lincoln (GB); Bruno Cerqueira Rente Ribeiro, London (GB); Paul Durnford Taylor, Lincoln (GB); Robin Adam Simpson, Lincoln (GB); Callum Tarr, Lincoln (GB); Michael David Nicholson, Lincoln (GB); Daniel Bell, Lincoln (GB); Tong Sun, London (GB); Kenneth Grattan, London (GB); Matthias Fabian, London (GB)

(73) Assignees: DYNEX SEMICONDUCTOR LIMITED, Lincolnshire (GB); ZHUZHOU CRRC TIMES SEMICONDUCTOR CO. LTD, Hunan (CN)

( * ) Notice: Subject to any disclaimer, the term of this patent is extended or adjusted under 35 U.S.C. 154(b) by 722 days.

(21) Appl. No.: 18/010,554

(22) PCT Filed: Apr. 20, 2021

(86) PCT No.: PCT/EP2021/060199
§ 371 (c)(1),
(2) Date: Dec. 15, 2022

(87) PCT Pub. No.: WO2022/223101
PCT Pub. Date: Oct. 27, 2022

(65) Prior Publication Data
US 2023/0236072 A1 Jul. 27, 2023

(51) Int. Cl.
*G01K 11/3206* (2021.01)
*G01K 1/143* (2021.01)
(Continued)

(52) U.S. Cl.
CPC .......... *G01K 11/3206* (2013.01); *G01K 1/143* (2013.01); *G01K 1/18* (2013.01);
(Continued)

(58) Field of Classification Search
CPC ...... G01K 11/3206; G01K 1/143; G01K 1/18; G02B 6/02; G02B 6/02076; H01L 21/00
See application file for complete search history.

(56) References Cited

U.S. PATENT DOCUMENTS

| | | | | |
|---|---|---|---|---|
| 10,861,682 | B2 * | 12/2020 | O'Banion | ......... H01J 37/32917 |
| 2002/0020696 | A1 * | 2/2002 | Kitamura | ............ H10P 72/0602 219/390 |

(Continued)

FOREIGN PATENT DOCUMENTS

| | | |
|---|---|---|
| CN | 102 169 028 A | 8/2011 |
| CN | 109443589 A | 3/2019 |

(Continued)

OTHER PUBLICATIONS

International Search Report and Written Opinion issued in connection with corresponding PCT Patent Application No. PCT/EP2021/060199 dated Dec. 23, 2021.
(Continued)

*Primary Examiner* — Laura Martin
*Assistant Examiner* — Philip L Cotey
(74) *Attorney, Agent, or Firm* — Tarolli, Sundheim, Covell & Tummino LLP

(57) ABSTRACT

There is provided a semiconductor device 100, comprising: at least one semiconductor chip 5, and a structure 2 thermally coupled to the at least one semiconductor chip 5,
(Continued)

100 wherein the structure 2 comprises a surface located within an interior of the semiconductor device, and the surface comprises a groove 12; and a sensor 16 comprising an optical fibre 13 passing through the groove 12, wherein the sensor 16 is configured to sense a temperature of the at least one semiconductor chip 5.

18 Claims, 6 Drawing Sheets

(51) Int. Cl.
*G01K 1/18* (2006.01)
*G02B 6/02* (2006.01)
*H10P 95/00* (2026.01)

(52) U.S. Cl.
CPC ............ *G02B 6/02* (2013.01); *G02B 6/02076* (2013.01); *H10P 95/00* (2026.01)

(56) References Cited

U.S. PATENT DOCUMENTS

2006/0140248 A1* 6/2006 Gotthold ............ G01K 11/3206
374/161

2011/0267598 A1* 11/2011 Hjort .................. G01K 11/3206
385/12
2015/0061100 A1* 3/2015 Beer ................... H10W 74/014
257/676
2019/0006157 A1* 1/2019 O'Banion ......... H01J 37/32917
2019/0360875 A1* 11/2019 Bergen ..................... G01K 1/20
2021/0090865 A1* 3/2021 O'Banion ......... H01J 37/32917
2021/0391193 A1* 12/2021 Matsushita ......... H10P 72/0432
2025/0164330 A1* 5/2025 Nguyen .................. G01L 1/246

FOREIGN PATENT DOCUMENTS

| CN | 110 631 616 A | 12/2019 |
|---|---|---|
| WO | 01/71301 A1 | 9/2001 |
| WO | 2011113443 A2 | 9/2011 |
| WO | 2014026264 A2 | 2/2014 |
| WO | 2015069623 A1 | 5/2015 |

OTHER PUBLICATIONS

Mohammed et al., "Distributed Thermal Monitoring of Wind Turbine Power Electronic Modules Using FBG Sensing Technology," in IEEE Sensors Journal, vol. 20, No. 17, pp. 9886-9894, 1 Sep. 1, 2020, doi: 10.1109/JSEN.2020.2992668.

* cited by examiner

S1

Forming a groove at a surface of a structure of a
semiconductor device

S2

Inserting an optical fibre of a sensor into the
groove

S3

Thermally coupling the structure to at least one
semiconductor chip of the semiconductor device,
such that the surface is located within an interior
of the semiconductor device

SEMICONDUCTOR DEVICE

RELATED APPLICATIONS

The present invention is a U.S. National Stage under 35 USC 371 patent application, claiming priority to PCT Application No. PCT/EP2021/060199, filed on Apr. 20, 2021; the entirety of which is hereby incorporated herein by reference.

TECHNICAL FIELD

The present disclosure relates to a semiconductor device and a method of mounting a sensor in a semiconductor device. More particularly, but not exclusively, the present disclosure relates to a power semiconductor device comprising a built-in temperature sensor, which is capable of real-time monitoring of individual chip temperatures during operation of the power semiconductor device.

BACKGROUND

A power semiconductor device may house one or more power semiconductor chips (or dies). The power semiconductor chips are often used to switch high currents and voltages, and may include one or more of a power transistor, a power diode, and a power thyristor, etc. A power transistor includes, but is not limited to, a power metal-oxide-semiconductor field effect transistor (MOSFET), a power bipolar junction transistor (BJT), an insulated gate bipolar transistor (IGBT), etc. The power semiconductor device may also be referred to as a power module or a power electronic module.

It is desirable to monitor the temperatures of power semiconductor chip(s) within a power semiconductor device. Measuring the chip temperature in real time is useful during the device manufacture, and during the commissioning and set up of a power electronics system (such as a power converter) which uses the device. Measuring the chip temperature in real time is also useful for on-going condition monitoring of the device, the power electronics system and/or an entire power system which incorporates the power electronics system, during operation of the device over its lifetime. Measuring the chip temperature during the operation of the device is further useful to ensure the chip remains within safe operating limits. Existing methods of temperature monitoring employed in commercial systems typically allow estimation of only the average temperature of chips within a device, but do not allow the measurement of individual chip temperatures. The existing methods may also not provide the facility to monitor the temperatures of different chip types (e.g. IGBTs and diodes) within the same device.

In particular, one known method for measuring the temperature of a power semiconductor device uses indirect techniques, such as measurement of a temperature sensitive electrical parameter (TSEP) from which chip temperature can be estimated. Such parameters include, but are not limited to, on-state voltage drop, threshold voltage and switching delay time. This known method is the state-of-the-art method for online temperature monitoring in press-pack power semiconductor devices during their operations in commercial systems.

By measuring the TSEP, the temperature within a specific area of the device can be estimated. The estimated temperature is typically between a maximum temperature and a minimum temperature within the specific area. For a multi-chip power semiconductor device where the chips and the connections for sensing the TSEP are typically connected in parallel, it is not possible to determine the temperatures of individual chips within the device using the TSEP method. Typically, the temperature is not uniform for chips within a device. Differences result from geometrical constraints and also manufacturing variances. Therefore, safety margins are applied to ensure all chips within a device remain within specified temperature limits.

Safety margins are typically arbitrary, since the spread of individual chip temperatures within the device is unknown. If the margin applied is too large, then even the hottest chips may operate significantly below their safe operating limit. If the safety margin is insufficient, the hottest chips may operate outside safe operating limits and therefore be prone to premature failure. Both scenarios are a cause of inefficiency in power electronics systems. Using a method that allows monitoring of the individual chip temperatures enables optimum exploitation of the potential of the device. Further, deviation of the chip temperatures outside the expected design limits can indicate other problems in the power electronics system, such as ageing of components both in the power semiconductor device and in other components such as capacitors or connectors etc. Therefore, using a method that allows monitoring of the individual chip temperatures is also very useful for condition monitoring of the power electronics system. However, this cannot be achieved by the known method of measuring TSEP. The existing methods may also not provide the facility to monitor the temperatures of different chip types (e.g. IGBTs and diodes) within the same device.

In addition, some TSEPs require measurements under low current conditions to ensure accuracy and prevent self-heating. Such measurements interfere with normal operations of the power electronics system, and therefore increase the difficulty of online temperature monitoring of the device.

Technologies, such as thermocouples and infrared sensors, can be used to monitor individual chips temperatures, but have significant drawbacks such as susceptibility to electromagnetic interference (EMI), isolation from high voltages present in systems or the requirement for extensive physical modifications to the device packaging, generally limiting them to laboratory studies and making them unviable for deployment in commercial systems.

It is known that Fibre Bragg Grating (FBG) sensors may be used to measure the temperature of a semiconductor device. An FBG sensor is a microstructure, in which a periodic change in refractive index is formed in an optical fibre, typically using a UV laser. The periodic change produces an optical grating. The grating is tuned in the sense that it would reflect a particular wavelength of light determined by the grating period. FBG sensors are not susceptible to EMI, and are inherently electrically isolated due to their non-conductive nature.

However, it remains challenging to easily and reliably mount the FBG sensors in a semiconductor device. For example, existing methods for integrating FBG sensors inside a traditional multi-chip power semiconductor device that uses wire bonds and soldering methods are troublesome. To manufacture a traditional multi-chip power semiconductor device, several power semiconductor chips are soldered to a substrate (e.g., a direct bonded copper substrate), followed by wire-bonding the chips to the substrate. Several such wire bonded substrates are then soldered to a baseplate, and interconnected. It is known that FBG sensors can be mounted on the top surfaces of the chips by a range of techniques, such as fixing by adhesives and potting compounds or using clips to position the fibres. Such mounting methods are complex, time consuming and typically would not provide reliable connections between the FBG sensors and the chips. Therefore, to the date of the present disclosure, FBG sensors have not been applied in traditional multi-chip power semiconductor devices for large scale commercial systems.

In a press-pack semiconductor device, connections between components are made either by bonding techniques, such as soldering or sintering, or by direct pressure contact between adjacent components. In both cases, the techniques typically make use of a high proportion of the contact area of each component. As such, to the date of the present disclosure, there has been no mounting solution for integrating FBG sensors in a press-pack semiconductor device.

It is therefore desirable to provide a solution for monitoring individual chip temperatures in a semiconductor device during its operation in a commercial system that is resistant to electromagnetic interference, inherently electrically isolated, minimises modifications to device design and manufacture and is suitable for any combination of chip types within the device.

It is an object of the present disclosure, among others, to provide an improved semiconductor device and an improved method of mounting a sensor in a semiconductor device, which solve problems associated with known semiconductor devices and known mounting methods, whether identified herein or otherwise.

SUMMARY

According to a first aspect of the present disclosure, there is provided a semiconductor device, comprising:

at least one semiconductor chip, and a structure thermally coupled to the at least one semiconductor chip, wherein the structure comprises a surface located within an interior of the semiconductor device, and the surface comprises a groove; and a sensor comprising an optical fibre passing through the groove, wherein the sensor is configured to sense a temperature of the at least one semiconductor chip.

Advantageously, the groove ensures the fast assembly processing of the semiconductor device, and also the easy removal or replacement of the optical fibre during manufacture. The addition of a groove to an existing structure of a semiconductor device adds no additional material to the device (except for the sensor), meaning that the difference in cost is reduced or minimal. The groove further reduces or minimises modifications to the device design and manufacture. In addition, using the groove to accommodate the optical fibre of the sensor enables better heat transfer characteristics between the semiconductor chip and the sensor than a surface mounting method, since the fibre is surrounded on all sides and therefore heat transfer occurs in all directions. For a surface mounting method, heat transfer may only occur in one direction.

With the expression "a surface located within an interior of the semiconductor device", it is intended to mean that the surface is not exposed to an exterior of the semiconductor device, and that the surface is covered or enclosed by structures/elements of the semiconductor device. In other words, the surface is an internal surface (or an inner surface) of the semiconductor device.

By forming the groove on the internal surface of the device, the groove can be placed in close proximity to the at least one semiconductor chip, thereby allowing the sensor to monitor individual chip temperatures rather than an average temperature of the entire semiconductor device. This advantageously enables optimum exploitation of the potential of the device, and also enables condition monitoring of a power electronics system which uses the device. Further, the sensor comprises an optical fibre. This type of optical sensor is resistive to electromagnetic interference (EMI), inherently electrically isolated, and is suitable for any combination of chip types. Further, the arrangement of the groove and the optical fibre mitigates the effects of the sensor and mounting solution on the thermal, mechanical and electrical characteristics of the device.

Therefore, the first aspect of the present disclosure enables improved online monitoring of individual chip temperatures within the semiconductor device, regardless of the type(s) of the at least one semiconductor chip, while requiring minimised modifications to existing device design and manufacture. The present disclosure provides significant advantages in health monitoring of the semiconductor device and, more importantly, a power electronics system which uses the semiconductor device, and may be especially beneficial for applications such as offshore wind or other applications where remote monitoring is necessary.

The term "thermally coupled" includes that one or more intervening element(s) adapted for thermal conduction may exist between the thermally coupled elements.

It would be appreciated that the "surface" may be part of a continuous surface of the structure. That is, the continuous surface of the structure may be partly covered or enclosed by the semiconductor device, and partly exposed to an exterior of the semiconductor device.

The "structure" may be any suitable structure of the device that is thermally coupled to the at least one semiconductor chip.

The sensor may further comprise at least one optical sensing unit associated with the optical fibre.

It would be appreciated that the particular location(s) of the at least one optical sensing unit relative to surface(s) of the at least one semiconductor chip may be designed suitably in order to best measure the chip temperatures during normal operation of the device. Generally speaking, a semiconductor chip may have an inhomogeneous temperature distribution on its surface, and may have a hottest point on its surface. Therefore, the particular location(s) of the at least one optical sensing unit may be aligned with the hottest point(s) of the at least one semiconductor chip, respectively. By the expression "aligned with", it is meant that the location(s) of the at least one optical sensing unit and the hottest point(s) of the at least one semiconductor chip are substantially coincident when viewed along a direction which is perpendicular to the surface of the structure.

The at least one optical sensing unit may comprise at least one optical grating formed in the optical fibre.

The semiconductor device may be a power semiconductor device.

The semiconductor device may further comprise at least one material arranged immediately between the at least one semiconductor chip and the structure, wherein the at least one material has a thermal resistance of less than or equal to 15° C.·mm²/W.

By the expression "immediately between", it is meant that there is nothing other than the "at least one material" that is arranged between the at least one semiconductor chip and the structure. It would be appreciated that the at least one material is provided in the thermal path between the at least one semiconductor chip and the structure, and therefore contributes to a total thermal resistance between the at least one semiconductor chip and the sensor.

The thermal resistance referred to in the present disclosure is a thermal resistance of unit area of the at least one material, and may also be referred to as the thermal insulance factor or the R-value.

The at least one material may comprise bonding material(s) (e.g., soldering/sintering material(s)), and/or material(s) of further structure(s) arranged between the at least one semiconductor chip and the structure.

A thermal resistance between the at least one semiconductor chip and the sensor may comprise a thermal resistance of the at least one material and an interface thermal resistance between the at least one material and the sensor.

The sensor may be configured to form an interference fit with the groove.

The semiconductor device may be configured such that a thermal resistance between the at least one semiconductor chip and the sensor is less than or equal to 30° C.·mm$^2$/W.

More specifically, the thermal resistance between the at least one semiconductor chip and the at least one optical sensing unit may be less than or equal to 30° C.·mm$^2$/W.

The sensor may be a fibre Bragg grating sensor.

The at least one semiconductor chip may comprise a plurality of semiconductor chips. The sensor may comprise a plurality of optical sensing units associated with the optical fibre. Positions of the plurality of optical sensing units may be aligned with positions of the plurality of semiconductor chips so as to sense local temperatures of the plurality of semiconductor chips, respectively.

A thermal resistance between each of the semiconductor chips and a respective one of the optical sensing units may be less than or equal to 30° C.·mm$^2$/W.

It would be appreciated that the ranges of the thermal resistance described in the present disclosure may allow for a degree of variability, for example, ±20%, in the stated values of the end points of the ranges. For instance, a stated limit of 15° C.·mm$^2$/W may be any number between 15*(1−20%)° C.·mm$^2$/W and 15*(1+20%)° C.·mm$^2$/W, and a stated limit of 30° C.·mm$^2$/W may be any number between 30*(1−20%)° C.·mm$^2$/W, and 30*(1+20%)° C.·mm$^2$/W.

The structure may be a metallic structure.

The structure may be a rigid structure.

Therefore, it may not be easy to bend the structure out of shape. Accordingly, the structure may protect the sensor from experiencing mechanical excitation (strain) effects. This may be helpful to improve the accuracy of the sensor in the thermal measurements, especially if the sensor has inherent thermos-mechanical cross-sensitivity.

The semiconductor device may be a press-pack power semiconductor device.

The structure may comprise a housing electrode of the press-pack power semiconductor device.

Alternatively the structure may comprise a strain buffer of the press-pack power semiconductor device.

The sensor may be positioned within about 2 millimetres of a surface of the at least one semiconductor chip.

The term "about" or "approximately" used in the present disclosure indicate a degree of variability (e.g., 20%) in the stated numerical values.

The structure may comprise a baseplate.

The structure may comprise a heat sink.

The sensor may comprise an elastic sheath surrounding at least a part of the optical fibre.

The sensor may comprise at least one optical sensing unit. The at least one optical sensing unit may not be covered by the elastic sheath.

The groove may have a square cross-sectional shape.

Alternatively, the groove may comprise two opposing side walls and a rounded wall connecting the two side walls.

The sensor may be held within the groove by friction with walls of the groove.

The sensor may be configured to sense an operating parameter of the semiconductor device. The operating parameter may comprise one or more of a strain, a stress, a magnetic field, or an electric field experienced by the at least one semiconductor chip.

According to a second aspect of the present disclosure, there is provided a method of mounting a sensor in a semiconductor device, the semiconductor device comprising at least one semiconductor chip and a structure, the sensor comprising an optical fibre, wherein the sensor is configured to sense a temperature of the at least one semiconductor chip, the method comprising:

forming a groove at a surface of the structure;

inserting the optical fibre into the groove; and thermally coupling the structure to the at least one semiconductor chip such that the surface is located within an interior of the semiconductor device.

Inserting the optical fibre into the groove may comprise forming an interference fit between the optical fibre and the groove.

Forming an interference fit may comprise press fitting or shrink fitting.

Where appropriate any of the optional features described above in relation to one of the aspects of the present disclosure may be applied to another one of the aspects of the disclosure.

BRIEF DESCRIPTION OF THE DRAWINGS

In order that the disclosure may be more fully understood, a number of embodiments of the disclosure will now be described, by way of example, with reference to the accompanying drawings, in which.

In the figures, like parts are denoted by like reference numerals.

It will be appreciated that the drawings are for illustration purposes only and are not drawn to scale.

DETAILED DESCRIPTION OF THE PREFERRED EMBODIMENTS

Figure 1:
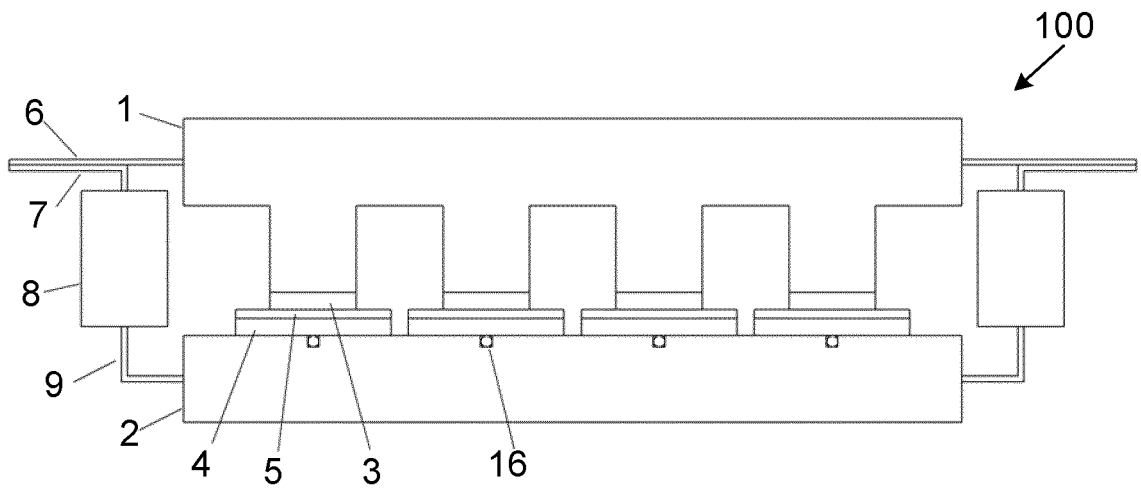
FIG. 1 is a schematic representation of a semiconductor device according to a first embodiment of the present disclosure.

FIG. 1 schematically illustrates a cross sectional view of a semiconductor device 100 (referred to as the "device" below) according to a first embodiment of the present disclosure. In this example, the semiconductor device 100 is embodied as a multi-chip press-pack power semiconductor device. Press-pack power semiconductor devices are an alternative to traditional isolated-base power semiconductor devices, in which power semiconductor chips are typically soldered on isolated substrates that carry the chips respectively and are also wire-bonded to the substrates. Instead of the wire bonds and solder joints used in isolated-base devices, press-pack devices typically rely on the application of force by an external clamping system, to make contact to the chips.

As shown in FIG. 1, the device 100 comprises an upper electrode 1, a lower electrode 2, upper strain buffers 3, lower strain buffers 4, and a plurality of power semiconductor chips 5 (referred to as the "chips" below). The upper strain buffers 3 are arranged between top surfaces of the chips 5 and the upper electrode 1. The lower strain buffers 4 are arranged between bottom surfaces of the chips 5 and the lower electrode 2. The upper electrode 1 and the lower electrode 2 provide a housing defining an interior in which the chips 5 are housed, and therefore may also be referred to as housing electrodes. The upper and lower electrodes 1, 2 are typically made of copper. The upper strain buffers 3 and the lower strain buffers 4 are typically made of molybdenum. The power semiconductor chips 5 may be made in silicon technology, or alternatively may be based upon other types of semiconductors, such as, silicon carbide, gallium nitride, or silicon germanium etc. The chips 5 may comprise one or more of a power transistor (e.g., an IGBT, a power MOSFET, a power BJT), a power diode, and a power thyristor etc. By clamping the chips 5 between the electrodes 1, 2, the chips 5 are electrically coupled to the electrodes 1, 2. The chips 5 are also thermally coupled to the electrodes 1, 2 via the strain buffers 3, 4.

During operation of the device 100, the device 100 heats and cools, and consequently each component of the device 100 undergoes thermal expansion and contraction. Difference in the thermal expansion coefficients of adjacent components leads to abrasive wear (also called "fretting") of their contact surfaces. The thermal expansion coefficients of silicon and molybdenum are more closely matched than those of silicon and copper. The strain buffers 3, 4 are useful for reducing the rate of wear on the surfaces of the chips 5. The chips 5 may be silver sintered (or otherwise bonded) to the strain buffers 3, 4 to further reduce the risk of fretting and reduce the thermal resistance of the chips 5. Dry interfaces may exist between the upper electrode 1 and the upper strain buffers 3, and/or between the lower electrode 2 and the lower strain buffers 4. A dry interface means that elements at opposite sides of the interface are coupled by pressure, and there is no bonding material between the elements.

The device 100 further comprises a lid flange 6, a housing upper flange 7, a ceramic cylinder 8, and a housing lower flange 9. These components form a gas tight connection between the upper electrode 1 and the lower electrode 2. The interior of the device 100 in which the chips 5 are housed is typically filled with nitrogen.

The device 100 further comprises a sensor 16 which is provided at the top surface of the lower electrode 2. As shown in FIGS. 1 and 4, the top surface of the lower electrode 2 is located within an interior of the device 100, and comprises a groove 12. The groove 12 may be a precision machined groove. As further shown in FIGS. 3 and 4, the sensor 16 comprises an optical fibre 13 passing through the groove 12, and a plurality of optical sensing units 15 associated with the optical fibre 13 and an elastic sheath 14 surrounding the optical fibre 13. The elastic sheath 14 however does not cover the optical sensing units 15. For the sake of simplicity, FIG. 3 only shows one optical sensing unit 15.

In an example, the sensor 16 is an FBG sensor, and each of the optical sensing units is an optical grating formed in the optical fibre 13, by for example a UV laser. Multiple optical gratings may be created at predetermined locations along the optical fibre 13. The properties of each optical grating are tailored to reflect a specific wavelength of light. The reflected wavelength for an individual optical grating will change if its properties are altered, for example, by temperature. Different optical gratings in a single optical fibre may reflect different wavelengths. The properties of the gratings are determined such that, as their reflected wavelength changes with temperature, there will be no overlap in the reflected wavelengths within a predetermined temperature range, allowing the responses of individual gratings to be distinguished from one another. The predetermined temperature range may be the operating temperature range of the device 100. It will be appreciated that the sensor 16 is not limited to an FBG sensor and may be any suitable type of optical sensor.

The locations of the optical sensing units 15 along the optical fibre 13 are specified to align with selected measurement points on the chips 5 in the device 100 when inserted into a groove (e.g., the groove 12) with a particular path. Typically, the selected measurement points may be the anticipated hottest points of the chips 5. The hottest points of the chips may be at the centres of the chips 5 or any other locations depending upon the design of the chips 5. In the example of FIG. 1, the selected measurement points are at the centres of the chips 5, and the optical sensing units 15 are located below and aligned with the centres of the chips 5. It would be appreciated that the term "align(ed) with" means that the locations of the optical sensing units 15 and the selected measurement points on the chips 5 are substantially coincident when viewed along a direction (e.g., a vertical direction in FIG. 1) which is perpendicular to the upper surface of the lower electrode 2. When the location of an optical sensing units 15 is aligned with the selected measurement point on a chip 5, the optical sensing units 15 and the selected measurement point are minimally separated with respect to one another. In this way, the thermal resistance between the optical sensing units 15 and the selected measurement point is minimised.

Figure 2:
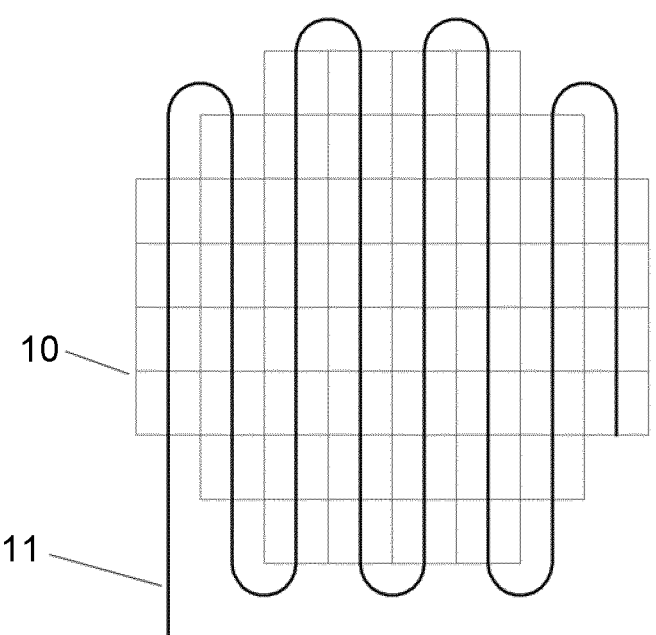
FIG. 2 is a schematic illustration of a path layout of a sensor used in the semiconductor device.

FIG. 2 schematically illustrates a path 11 of the sensor 16 with respect to a two-dimensional pattern 10 of the chips 5. The optical fibre 13 of the sensor 16 follows the path 11. At least a part of the groove 12 may also be aligned with the path 11. As shown in FIG. 2, the path 11 is a continuous path winding through centres of all of the chips 5 within the two-dimensional pattern 10. In an event that the selected measurement points on the chips 5 are not at the centres of the chips 5, the path 11 may be varied accordingly to wind through the selected measurement points on the chips 5. It would be understood that the path 11 of the sensor 16 is generally determined by the pattern 10 of the chips 5 within the device 100. If a different pattern of chips is used then the path of the sensor may be altered accordingly.

Figure 3:
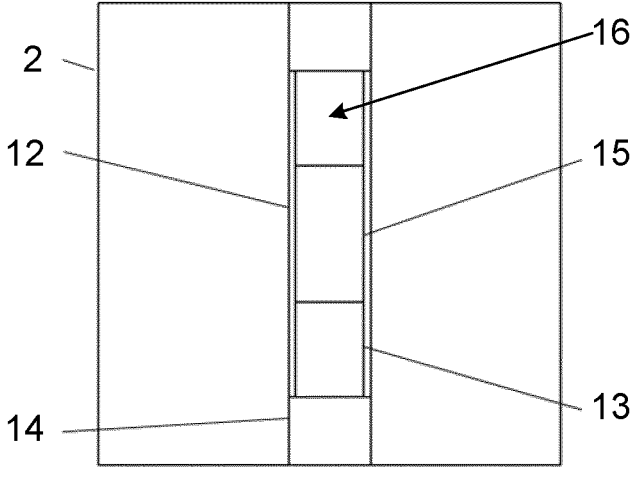
FIG. 3 is a partial, plan view of a lower electrode of the semiconductor device according to the first embodiment.
Figure 4:
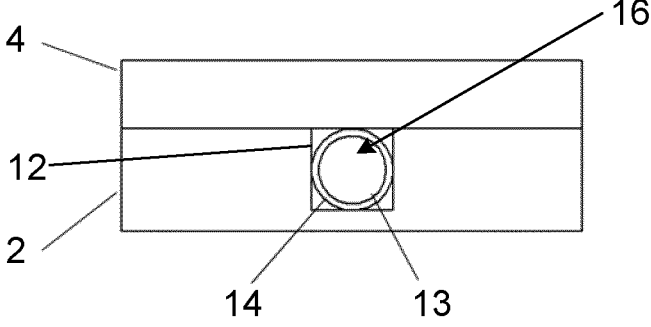
FIG. 4 is a partial, sectional view of the semiconductor device according to the first embodiment.

As shown in FIGS. 3 and 4, an elastic sheath 14 is provided to surround the optical fibre 13 between two adjacent optical sensing units 15. The elastic sheath 14 may be a heat shrink sleeve. The elastic sheath 14 is not placed over the optical sensing units 15 to ensure that the sheath 14 does not interfere with the responses of the optical sensing units 15. Being an assembly of the optical fibre 13 and the elastic sheath 14, the sensor 16 may also be referred to as a sensor assembly.

During the manufacture of the housing electrodes of the device 100, a groove (e.g., the groove 12) with a specified width, depth and path are formed at the inner surface (e.g., the top surface) of the lower electrode 2. The width and depth of the groove 12 may be equal to an outer diameter of the sensor 16. The sensor 16 is pressed into the groove 12. The similar dimensions of the sensor 16 and the groove 12 mean that an interference fit is achieved, whereby the sensor 16 is held within the groove by friction with the walls of the groove 12. Further, the similar dimensions of the sensor 16 and the groove 12 also mean that the sensor 16 directly contacts bottom surfaces of the lower strain buffers 4. This is useful for improving the heat transfer from the lower strain buffers 4 to the sensor 16. The elastic sheath 14 is useful to aid press fitting by providing additional compensation for variations in groove dimensions as well as increasing friction between the sensor 16 and the internal surfaces of the groove 12.

The sensor 16 is connected to the internal port of a feed-through connector, which may be integrated into a wall of the ceramic cylinder 8. The feed-through connector may also be integrated into the housing lower flange 9. The feedthrough connector allows communication between the sensor 16 which is inside the device 100 and a monitoring equipment outside the device 100. With the sensor 16 installed in the lower electrode 2, the semiconductor device 100 is assembled as shown in FIG. 1. It would be appreciated that instead of the use of a feedthrough connector at the wall of the lower electrode 2, the sensor 16 may be passed through open holes in the wall of the lower electrode 2 and fixed in place by some other means, such as adhesive, moulded polymer, grommets, clips, or any other suitable method.

Once the assembly process of the device 100 has been completed, the temperature response of the sensor 16 may be calibrated. During the calibration, a monitoring system may be connected to the device 100. The monitoring system comprises hardware typically referred to as an interrogator, which incorporates a swept laser source and a photo-detector capable of capturing the responses of the optical sensing units 15 of the sensor 16, and software, which allows identification and recording of the peak wavelength (shift) of each grating. The temperature of the device 100 is changed to defined values, for example, by heating in an oven. The monitoring system is used to measure and record the change in the reflected wavelengths of the optical sensing units 15 at difference temperatures. Typically, responses of the optical sensing units 15 may be measured at multiple temperatures within the expected operating temperature range of the device 100. From the data, a relationship between temperatures and responses of the optical sensing units 15 is determined and recorded for future use by the end user of the device 100.

In a typical end-user application, the device 100 would be assembled in a mechanical clamping system and connected to an electronic circuit, as is normal for any other press-pack power semiconductor device. As was the case during the calibration process, a monitoring system is connected to the device 100. The monitoring system is loaded with the calibration data of the sensor 16. The monitoring system continually interrogates the optical sensing units 15 at a predetermined frequency and logs their responses, enabling the end user to monitor individual sensor temperatures during operation. Further processing of the data may be suitably determined by the end user.

In the device 100, by forming a groove 12 at the internal surface of the lower electrode 2 (i.e., the top surface of the lower electrode 2), the sensor 16 is provided at a location in close proximity to the chips 5. In the example of FIG. 1, the sensor 16 is immediately below the lower strain buffers 4 which interface the chips 5, and the sensing units 15 of the sensor 16 are positioned within 2 mm of the surfaces of the chips 5, respectively. This 2 mm distance is much less than the case in which the sensor 16 were mounted on an external surface of the device 100 (e.g., the bottom surface of the lower electrode 2 or the top surface of the upper electrode 1). Consequently, the short distance between the sensor 16 and the surfaces of the chips 5 within the device 100 provides a relatively low thermal resistance path between the sensing units 15 and the chips 5. The groove mounting method further enables better heat transfer characteristics between the chips 5 and the sensing units 15 of the sensor 16 than surface mounting methods. This is because, as shown in FIG. 4, the optical fibre 13 is surrounded on all sides by the three walls of the groove 12 and bottom surfaces of the lower strain buffers 4. Therefore heat transfer occurs in all directions to the sensor 16. In contrast, heat transfer may only occur in one direction for a surface mounting method.

In an example where the lower strain buffers 4 are 2 mm-thick and are made of molybdenum, a unit-area thermal resistance of the lower strain buffers 4 is about 14.5° C.·mm$^2$/W. The unit-area thermal resistance may also be referred to as a thermal insulance factor or an R-value. The formula for calculating a unit-area thermal resistance of a material is known as R=L/k, where L is the length of the material (e.g., the thickness of the lower strain buffers 4), and k is the thermal conductivity of the material. The k value of molybdenum is approximately 138 W/m·K. By dividing the unit-area thermal resistance by a cross-sectional area of the material, an absolute thermal resistance (° C./W or K/W) of the material would be obtained. Unless specified otherwise, the "thermal resistance" used in the present disclosure refers to a unit-area thermal resistance. As described above, a bonding material (e.g., a soldering/sintering material) may be arranged immediately between the chips 5 and the lower strain buffers 4. The bonding material typically has a very low thermal resistance (e.g., less than 0.25° C.·mm$^2$/W). The bonding material as well as a material of the lower strain buffers 4 may be collectively referred to as "at least one material arranged immediately between" the chips 5 and the lower electrode 2. The bonding material and the lower strain buffers 4 have a combined thermal resistance of less than or equal to approximately 15° C.·mm$^2$/W.

Further in the example of FIG. 1, a dry interface exists between the lower strain buffer 4 and the sensor 16, and between the lower strain buffers 4 and the lower electrode 2. The thermal resistance of the dry interface can be determined experimentally, and for example may be within a range of between 13° C.·mm$^2$/W to 15° C.·mm$^2$/W depending upon the pressure exerted across the dry interface.

Accordingly, the total thermal resistance between the chips 5 and the sensing units 15 of the sensor 16 is estimated to be less than or approximately 30° C./W·mm² and thermal time constants are satisfactory. Therefore, due to the relatively low thermal resistance between the chips 5 and the sending units 15, the temperature experienced by a sensing unit 15 is approximately equal to the temperature of an individual chip 5 placed above the respective sensing unit 15. In this way, the sensor 16 is able to sense the temperatures of individual chips 5 (rather than an average temperature of the entire device 100) within the press-pack power semiconductor device 100 in real time during operation of the device 100. This advantageously enables each chip 15 to be monitored individually.

On the other hand, the groove mounting method of the sensor 16 brings minimal effects to the thermal characteristics of the device 100, because the groove 12 or the sensor 16 itself has a small footprint and their impact on the heat dissipation from the chips 5 to the exterior of the device 100 is almost negligible. For similar reasons, the groove mounting method of the sensor 16 has minimal effects on the electrical and mechanical characteristic of the device 100. Both heat and electric current flow to and from the chips 5 via the housing electrodes 1, 2. Further, the clamping pressure is also loaded to the chips 5 via the housing electrode 1, 2. Since the groove 12 has a dimension which is much smaller than that of the lower electrode 2, the groove 12 and the sensor 16 would not substantially affect the electrical and thermal conductivities or the clamping pressure exerted by the lower electrode 2.

The groove mounting method of the sensor 16 further allows for faster assembly processing of the device 100 as compared to fixing the sensor 16 to the device 100 with adhesives. The groove mounting method also allows easy removal or replacement of the optical fibre 13 during manufacture. The addition of the groove 12 to an existing structure (e.g., the lower electrode 2) of the device 100 adds no additional material to the device 100 (except for the sensor 16), meaning that the difference in cost is minimal, and also adds no additional weight and size to the device 100. For many power applications, it is important to maintain the weight and size of the device 100. The groove 12 further minimises modifications to the design and manufacture of the device 100.

Figure 5:
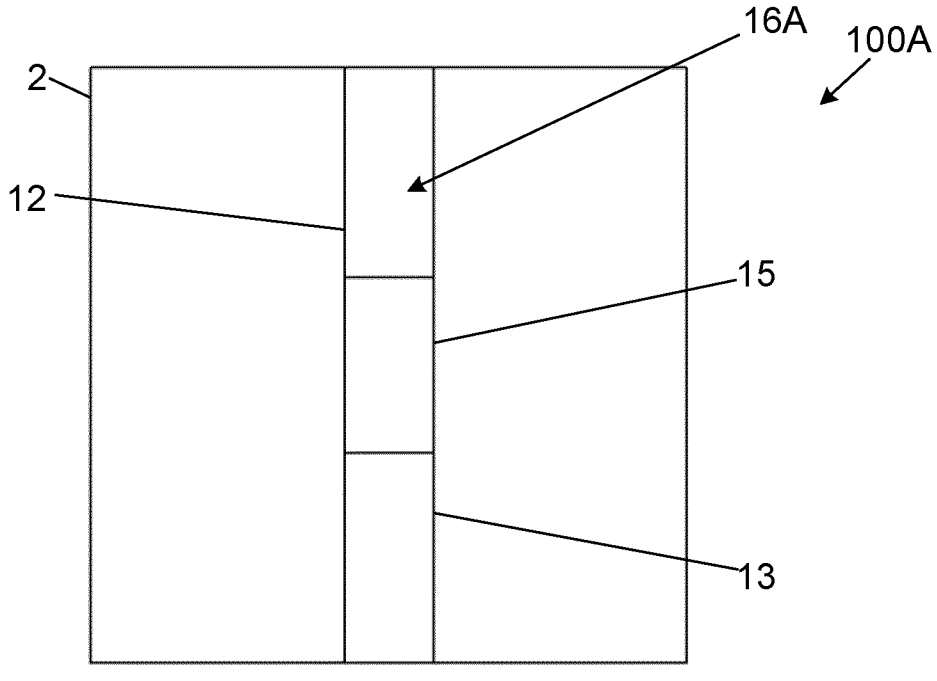
FIG. 5 is a partial, plan view of a lower electrode of a semiconductor device according to a second embodiment of the present disclosure.
Figure 6:
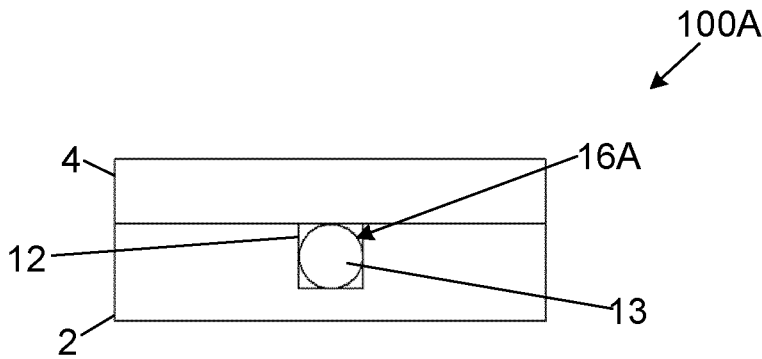
FIG. 6 is a partial, sectional view of the semiconductor device according to the second embodiment.

It would be appreciated that the elastic sheath 14 may be omitted. FIGS. 5 and 6 illustrate a semiconductor device 100A according to a second embodiment of the present disclosure. As shown in FIGS. 5 and 6, the device 100A comprises a sensor 16A. The sensor 16A comprises an optical fibre 13 and optical sensing units 15 associated with the optical fibre 13. For the sake of simplicity, FIG. 5 only shows one optical sensing unit 15. The optical fibre 13 is directly placed in the groove 12 without any sheath. The device 100A is otherwise identical to the device 100 of the first embodiment. Omitting the elastic sheath 14 may require the groove 12 to be formed with higher precision than if an elastic sheath was used. This is because the optical fibre 13 (typically made of glass) and the material (typically copper) of the lower electrode 2 are relatively incompressible, meaning that deviations in dimensions are less readily compensated. Alternatively, a special optical fibre that has inherent compliance may be used without an elastic sheath 14 and without additional precision in the manufacture of the groove 12.

As shown in FIGS. 4 and 6, the groove 12 has a square cross-sectional shape. The groove 12 may have a different cross-sectional profile. For example, the groove may comprise two opposing vertical side walls and a rounded bottom wall connecting the two side walls. The rounded bottom wall may have a shape that matches the shape of the optical fibre 13, so as to increase the contact area and to further improve the heat transmission between the lower electrode 2 and the fibre 13.

The groove 12 may be specified to be nominally smaller than the diameter of the sensor 16 or 16A. The interference fit between the groove 12 and the sensor 16 or 16A may be achieved by a shrink fitting process. During the shrink fitting process, either the structure (e.g., the lower electrode 2 or other structures described below) which comprises the groove 12 may be heated to cause itself to expand, or the sensor 16 or 16A may be cooled to cause itself to contract. When the structure and the sensor are brought to a common temperature, a secure interference fit would be made therebetween.

Creating an interference fit between the sensor 16 or 16A and the groove 12 provides several advantages. Firstly, unlike the known method of using adhesives or potting compounds to fix an FBG sensor to a chip surface, the sensor 16 or 16A is tightly fitted into the groove 12 but is not fixed or constrained. While walls of the groove 12 exert pressure to the sensor, the pressure induced mechanical-strain effect can be removed by resetting the wavelength baseline during the calibration of the sensor prior to the start of the measurement. Therefore, an inherent thermal-mechanical cross-sensitivity of the sensor 16 or 16A would not induce noticeable error to the temperature measurement. Secondly, the interference fit between the sensor and the groove 12 allows the sensor to directly contact walls of the groove 12, thereby improving the thermal transfer between the sensor and the chips 5 and improving the accuracy of the temperature measurement. Thirdly, the interference fit allows the groove 12 to have a relatively small profile, and thus ensures that the groove mounting method brings minimal impacts to the electrical, thermal and mechanical characteristics of the device.

While FIG. 1 shows that the groove 12, which accommodates the sensor 16, is formed at the internal surface of the lower electrode 2, it would be understood that the sensor 16 may be mounted in alternative locations within the device.

Figure 7:
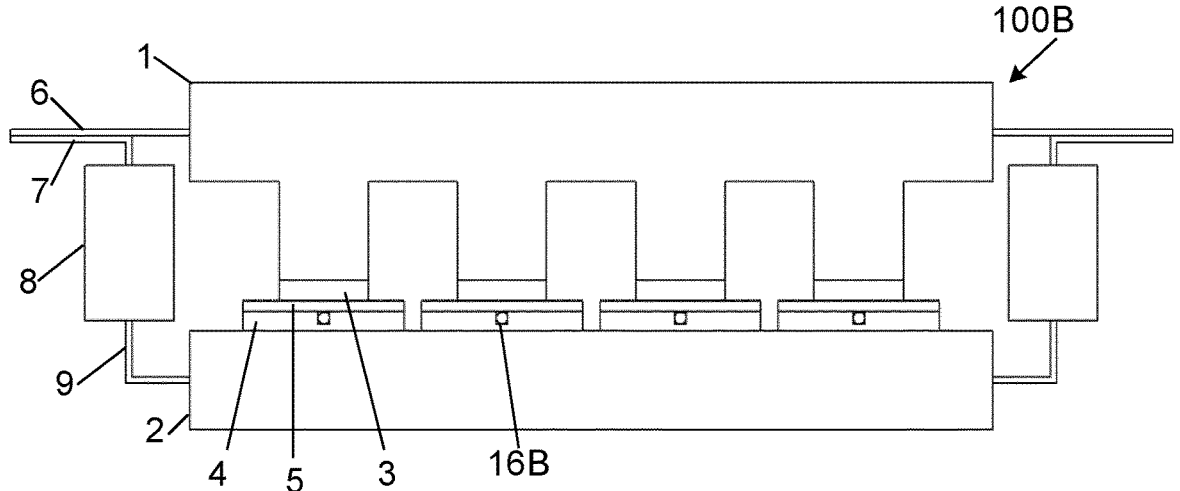
FIG. 7 is a schematic representation of a semiconductor device according to a third embodiment of the present disclosure.

For example, FIG. 7 shows a multi-chip press-pack power semiconductor device 100B, in which a groove is formed at the top surfaces of the lower strain buffers 4, and a sensor 16B which is otherwise identical to the sensor 16 or 16A is provided within the groove so as to touch the bottom surfaces of the chips 5.

Figure 8:
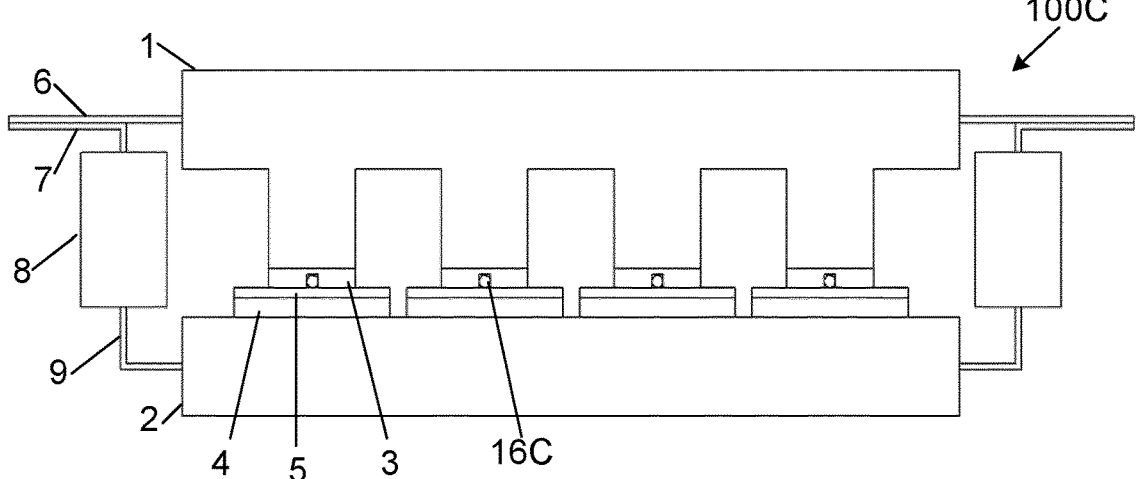
FIG. 8 is a schematic representation of a semiconductor device according to a fourth embodiment of the present disclosure.

FIG. 8 shows a multi-chip press-pack power semiconductor device 100C, in which a groove is provided at the bottom surfaces of the upper strain buffers 3, and a sensor 16C which is otherwise identical to the sensor 16 or 16A is provided within the groove so as to touch the upper surfaces of the chips 5.

Figure 9:
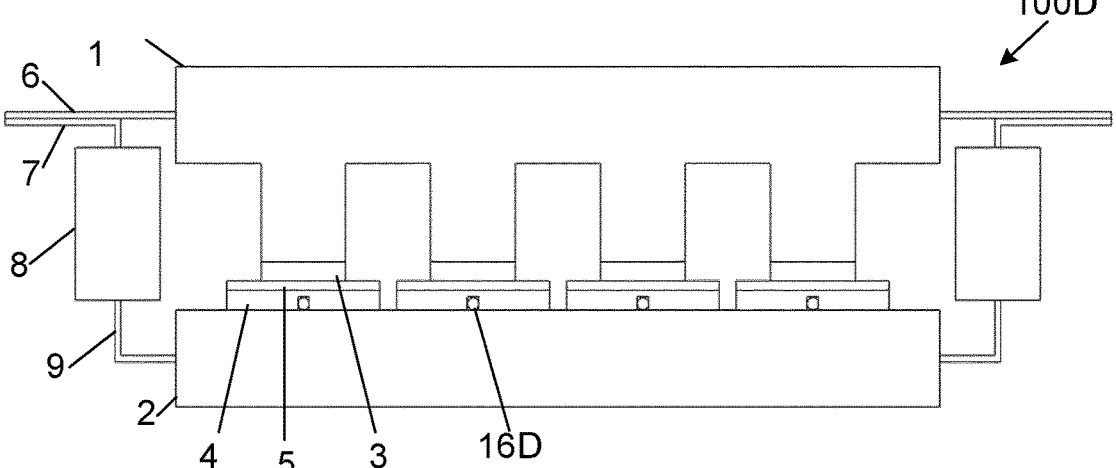
FIG. 9 is a schematic representation of a semiconductor device according to a fifth embodiment of the present disclosure.

FIG. 9 shows a multi-chip press-pack power semiconductor device 100D, in which a groove is provided at the bottom surfaces of the lower strain buffers 4, and a sensor 16D which is otherwise identical to the sensor 16 or 16A is provided within the groove.

Figure 10:
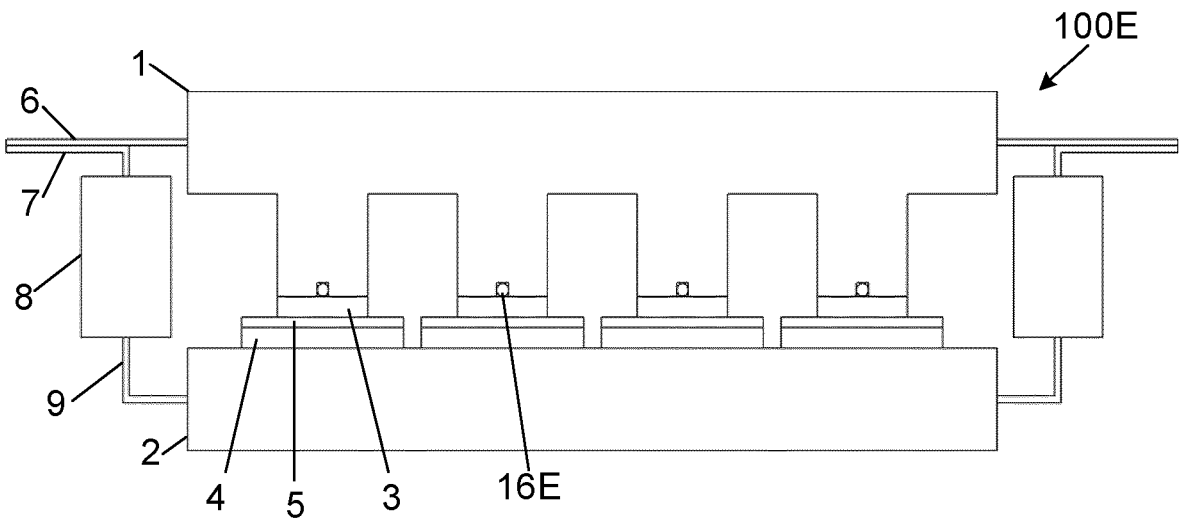
FIG. 10 is a schematic representation of a semiconductor device according to a sixth embodiment of the present disclosure.

Further, FIG. 10 shows a multi-chip press-pack power semiconductor device 100E, a groove is provided at the bottom surface of the upper electrode 1, and a sensor 16E which is otherwise identical to the sensor 16 or 16A is provided within the groove.

The top/bottom surfaces of the lower strain buffers 4, the top/bottom surfaces of the upper strain buffers 3 as well as the top surface of the lower electrode 2 and the bottom surface of the upper electrode 1 are all located within an interior of the device 100, 100B-100E, and thus are internal surfaces of the device 100, 100B-100E.

Therefore, the present disclosure provides a novel mounting solution, which allows a temperature sensor 16-16E (e.g., a FBG sensor) to be mounted inside a multi-chip press-pack power semiconductor device 100-100E at a location in close proximity to or even touching the chips 5. This mounting solution allows the sensor to monitor the local temperatures of individual chips within the press-pack power semiconductor device in real time during operation of the press-pack power semiconductor device. Incorporation of local temperature monitoring in press-pack power semiconductor devices has not been realised prior to the present disclosure.

In the multi-chip press-pack power semiconductor devices 100-100E as shown in FIGS. 1 and 7-10, housing electrodes 1, 2 are used as a means of applying pressure. Alternatively, a different means of applying pressure, such as a spring mechanism, may be used.

Figure 11:
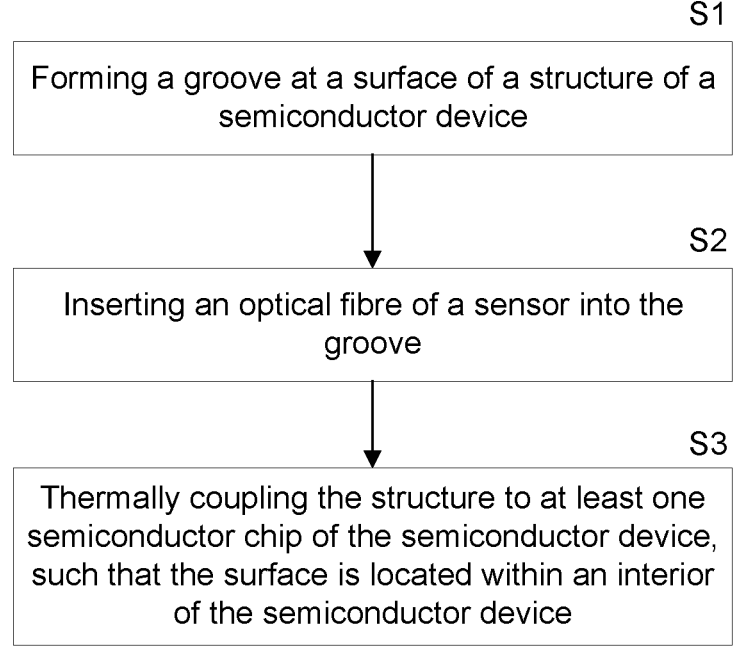
FIG. 11 schematically illustrates processing steps of a method for mounting a sensor in a semiconductor device.

FIG. 11 schematically illustrates processing steps of a method for mounting a sensor (e.g., any of the sensors 16-16E) in a semiconductor device (e.g., any of the devices 100-100E). The semiconductor device comprises at least one semiconductor chip (e.g., the chips 5), and a structure (e.g., any of the housing electrodes 1, 2, and the strain buffers 3, 4). The sensor comprises an optical fibre (e.g., the optical fibre 13). The sensor is a temperature sensor.

At step S1, a groove (e.g., the groove 12) is formed at a surface of the structure. The groove may be a precision machined groove.

At step S2, the optical fibre is inserted into the groove. Inserting the optical fibre into the groove may comprise forming an interference fit between the optical fibre and the groove. The interference fit may be achieved by for example press fitting or shrink fitting as described above.

At step S3, the structure is thermally coupled to the at least one semiconductor chip, such that the surface is located within an interior of the semiconductor device. In this way, the sensor is placed at a location in close proximity to or even touching the at least one semiconductor chip, and thus is able to monitor the individual chip temperature within the semiconductor device.

While FIGS. 1 and 7 to 10 relate to multi-chip press-pack power semiconductor devices, it would be appreciated that the groove mounting method of the sensor may equally be used in single-chip press-pack power semiconductor devices such as thyristors, diodes and transistors. In these devices, the sensors 16-16E may be used to measure the temperature of the single chip at a single point within the device, or the temperature of the single chip at a number of different locations.

The groove mounting method of the sensor may also be used in other types of power semiconductor devices, such as, traditional plastic power semiconductor modules or double-side bonded modules. For example, a groove similar to the groove 12 may be formed at an internal surface of a direct bonded copper (DBC) substrate or a metallic baseplate of a traditional plastic power semiconductor module, or at an internal surface of a heat sink that is typically used with that type of module. A temperature sensor 16-16E may be installed within the groove to measure temperature(s) at a single location or at multiple locations. A double-side bonded module has a soldering or sintering joint at either side of the chips, so as to sandwich the chips between two substrates (e.g., two DBC substrates). A groove similar to the groove 12 may be formed at an internal surface of either substrate. A temperature sensor 16-16E may be installed within the groove to measure temperature(s) at a single location or at multiple locations. Because the sensor 16-16E is made of glass, it is able to withstand typical soldering or sintering temperatures.

The exact structure of the module in which the groove is formed may be determined with consideration of material properties such as thermal conductivity, specific heat and density, so as to achieve a thermal resistance of less than or equal to approximately 30° C.·mm²/W between the chips and the sensing units 15 of the sensor 16-16E. More preferably, it is expected that at least one material arranged immediately between the chips and the exact structure in which the groove is formed has a thermal resistance of less than or equal to approximately 15° C.·mm²/W. In this way, the sensing units 15 would be able to monitor the local temperature of individual chip(s) within the module, rather than an average temperature of the module.

Generally speaking, thermal resistance can be determined by calculation as described above or by simulation using finite element analysis techniques in software packages such as ANSYS, or can be measured experimentally, all of which are objective procedures usual in the art. For example, a thermal resistance of a material/structure may be measured by detecting a temperature difference between two defined surfaces of the material/structure, and dividing the temperature difference by a unit-area power applied to the material/structure.

It would further be appreciated that the groove mounting method of the sensors 16-16E may be used in any type of semiconductor devices.

As described above, the sensors 16-16E may be FBG sensors. FBG sensors can also be used to monitor other operating parameters of a semiconductor device, such as strain, stress, magnetic field, and/or electric field experienced by the chips 5 in the device. It is therefore possible to use the sensors 16-16E to monitor any of these operating parameters other than temperature.

Figure 12:
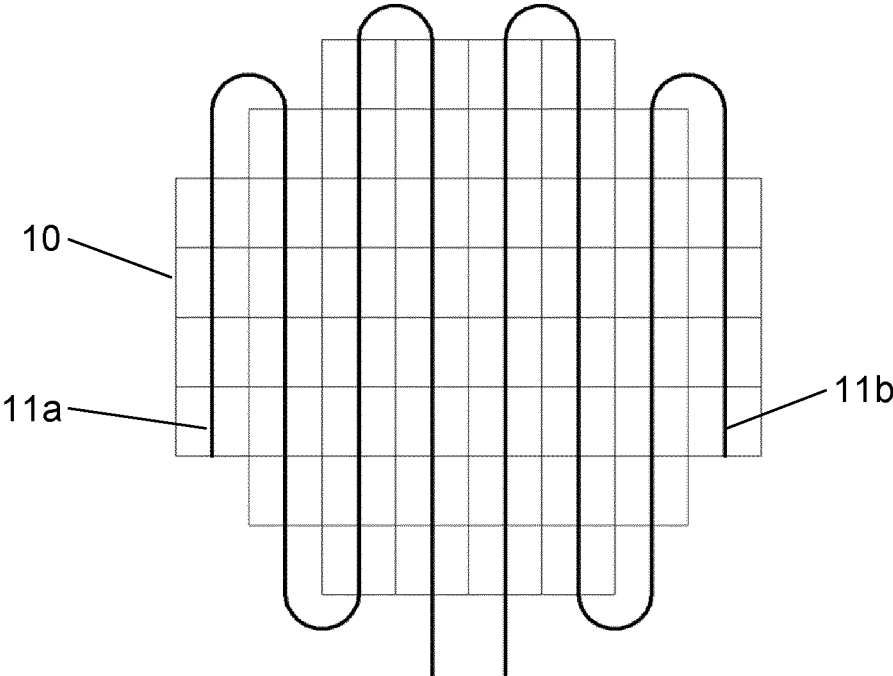
FIG. 12 is a schematic illustration of an alternative path layout of a sensor used in the semiconductor device.

FIGS. 1 and 2 show that a single sensor 16 which winds through the chips is used within the device 100. It would be appreciated that multiple sensors may be used within a single device. FIG. 12 illustrates two paths 11*a*, 11*b* of two sensors with respect to a two-dimensional pattern 10 of the chips 5. The optical fibre of one sensor follows the path 11*a*, and the optical fibre of the other sensor follows the path 11*b*. Comparing FIGS. 2 and 12, it would be understood that if multiple sensors are used, their paths would be altered accordingly.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'upper', 'lower', 'top', 'bottom', 'below', 'vertical', etc. are made with reference to conceptual illustrations of a semiconductor device, such as those showing standard layout plan views and those shown in the appended drawings. These terms are used for ease of reference but are not intended to be of limiting nature. These terms are therefore to be understood as referring to a semiconductor device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device, comprising:
at least one semiconductor chip, and
a structure electrically and thermally coupled to the at least one semiconductor chip, wherein the structure comprises a surface located within an interior of the semiconductor device, and the surface comprises a groove, and wherein the structure is separate from the at least one semiconductor chip; and
a sensor comprising an optical fibre passing through the groove, wherein the sensor is configured to sense a temperature of the at least one semiconductor chip, wherein the sensor is held within the groove by friction with walls of the groove.

2. A semiconductor device according to claim 1, further comprising at least one material arranged immediately between the at least one semiconductor chip and the structure, wherein the at least one material has a thermal resistance of less than or equal to 15° C.·mm²/W.

3. A semiconductor device according to claim 1, wherein the sensor is a fibre Bragg grating sensor.

4. A semiconductor device according to claim 1, wherein:
the at least one semiconductor chip comprises a plurality of semiconductor chips;
the sensor comprises a plurality of optical sensing units associated with the optical fibre, and
positions of the plurality of optical sensing units are aligned with positions of the plurality of semiconductor chips so as to sense local temperatures of the plurality of semiconductor chips, respectively.

5. A semiconductor device according to claim 1, wherein the structure is a metallic structure.

6. A semiconductor device according to claim 1, wherein the structure is a rigid structure.

7. A semiconductor device according to claim 1, wherein the semiconductor device is a press-pack power semiconductor device.

8. A semiconductor device according to claim 7, wherein the structure comprises a housing electrode of the press-pack power semiconductor device.

9. A semiconductor device according to claim 7, wherein the structure comprises a strain buffer of the press-pack power semiconductor device.

10. A semiconductor device according to claim 7, wherein the sensor is positioned within about millimeters of a surface of the at least one semiconductor chip.

11. A semiconductor device according to claim 1, wherein the structure comprises a baseplate.

12. A semiconductor device according to claim 1, wherein the sensor comprises an elastic sheath surrounding at least a part of the optical fibre.

13. A semiconductor device according to claim 12, wherein the sensor comprises at least one optical sensing unit, and the at least one optical sensing unit is not covered by the elastic sheath.

14. A semiconductor device according to claim 1, wherein the groove comprises two opposing side walls and a rounded wall connecting the two side walls.

15. A semiconductor device according to claim 1, wherein the sensor is configured to sense an operating parameter of the semiconductor device, the operating parameter comprising one or more of a strain, a stress, a magnetic field, or an electric field experienced by the at least one semiconductor chip.

16. A method of mounting a sensor in a semiconductor device, the semiconductor device comprising at least one semiconductor chip and a structure, the sensor comprising an optical fibre, wherein the sensor is configured to sense a temperature of the at least one semiconductor chip, the method comprising:
forming a groove at a surface of the structure;
inserting the optical fibre into the groove; and
thermally and electrically coupling the structure to the at least one semiconductor chip such that the surface is located within an interior of the semiconductor device, wherein the sensor is held within the groove by friction with walls of the groove, and the structure is separate from the at least one semiconductor chip.

17. A method of mounting a sensor in a semiconductor device according to claim 16, wherein inserting the optical fibre into the groove comprises forming an interference fit between the optical fibre and the groove.

18. A method of mounting a sensor in a semiconductor device according to claim 17, wherein forming an interference fit comprises press fitting or shrink fitting.

* * * * *